(12) United States Patent
Mori et al.

(10) Patent No.: US 11,019,722 B2
(45) Date of Patent: May 25, 2021

(54) WIRING SUBSTRATE

(71) Applicant: SHINKO ELECTRIC INDUSTRIES CO., LTD., Nagano (JP)

(72) Inventors: Kenichi Mori, Nagano (JP); Yoshihiro Kita, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/448,205

(22) Filed: Jun. 21, 2019

(65) Prior Publication Data
US 2019/0394870 A1    Dec. 26, 2019

(30) Foreign Application Priority Data

Jun. 26, 2018  (JP) .............................. JP2018-120772

(51) Int. Cl.
| | |
|---|---|
| *H05K 1/02* | (2006.01) |
| *H05K 1/11* | (2006.01) |
| *H05K 3/00* | (2006.01) |
| *H05K 3/40* | (2006.01) |
| *H05K 3/46* | (2006.01) |
| *H05K 1/18* | (2006.01) |

(52) U.S. Cl.
CPC ........... *H05K 1/028* (2013.01); *H05K 1/0218* (2013.01); *H05K 1/115* (2013.01); *H05K 3/0032* (2013.01); *H05K 3/0055* (2013.01); *H05K 3/4038* (2013.01); *H05K 3/4644* (2013.01); *H05K 1/0278* (2013.01); *H05K 1/18* (2013.01); *H05K 2201/09063* (2013.01); *H05K 2201/09827* (2013.01); *H05K 2203/107* (2013.01)

(58) Field of Classification Search
CPC ...... H05K 1/028; H05K 1/115; H05K 1/0218; H05K 3/0032; H05K 3/4038; H05K 3/4644; H05K 3/0055; H05K 2201/09063; H05K 2201/09827; H05K 2203/107
See application file for complete search history.

(56) References Cited

U.S. PATENT DOCUMENTS

| | | | |
|---|---|---|---|
| 6,429,385 B1 * | 8/2002 | Tandy | H05K 3/0097 174/254 |
| 2006/0244141 A1 * | 11/2006 | Kuan | H01L 23/49894 257/737 |
| 2012/0097433 A1 | 4/2012 | Kato et al. | |

(Continued)

FOREIGN PATENT DOCUMENTS

| | | |
|---|---|---|
| JP | 2000-114728 A | 4/2000 |
| JP | 2007-281145 A | 10/2007 |

(Continued)

*Primary Examiner* — Ishwarbhai B Patel
(74) *Attorney, Agent, or Firm* — Rankin, Hill & Clark LLP

(57) ABSTRACT

A wiring substrate includes a plurality of wiring layers, a component mounting part on which an electronic component can be mounted, and a component non-mounting part on which an electronic component cannot be mounted. A portion located in the component non-mounting part of one wiring layer of the plurality of wiring layers includes a plurality of first through-holes having an elongated shape as seen from above and aligned with predetermined intervals with longitudinal directions of the first through-holes being faced toward a direction perpendicular to a longitudinal direction of the wiring substrate.

13 Claims, 8 Drawing Sheets

1A

(56) References Cited

U.S. PATENT DOCUMENTS

2014/0048312 A1    2/2014  Kato et al.
2014/0145317 A1*  5/2014  Nakamura ........ H01L 23/49822
                                                               257/669
2016/0020500 A1    1/2016  Matsuda

FOREIGN PATENT DOCUMENTS

JP        2012-134551 A    7/2012
JP        2016-004875 A    1/2016

* cited by examiner

WIRING SUBSTRATE

CROSS-REFERENCE TO RELATED APPLICATIONS

This application is based upon and claims the benefit of priority from prior Japanese patent application No. 2018-120772, filed on Jun. 26, 2018, the entire contents of which are incorporated herein by reference.

TECHNICAL FIELD

The present invention relates to a wiring substrate.

BACKGROUND ART

A wiring substrate that is to be used for a wearable terminal and the like may be used with being bent. When the wiring substrate is used with being bent, a wiring pattern or via wiring arranged in the bent part is peeled off due to stress generated upon the bending, so that a conduction failure may occur. For this reason, for example, measures of adjusting a pitch and a diameter of the via wiring in the bent part are taken.

Also, copper foils having partially removed portions (through-holes) are arranged on front and back surfaces of the wiring substrate, and the copper foil-removed portions of the front surface and the copper foil-removed portions of the back surface are offset each other to increase bendability of the wiring substrate. Also, a mesh ground layer is arranged at an outer periphery of the bent part so as to increase the bendability of the wiring substrate.

[PTL 1] JP-A-2000-114728
[PTL 2] JP-A-2016-4875

However, as the wiring substrate has a plurality of wiring layers and a plurality of insulation layers which are stacked, it is needed to further improve the bendability.

SUMMARY OF INVENTION

Aspect of non-limiting embodiments of the present disclosure relates to provide a wiring substrate having improved bendability.

Aspects of certain non-limiting embodiments of the present disclosure address the features discussed above and/or other features not described above. However, aspects of the non-limiting embodiments are not required to address the above features, and aspects of the non-limiting embodiments of the present disclosure may not address features described above.

A wiring substrate according to a non-limiting embodiments of the present disclosure comprises:
 a plurality of wiring layers;
 a component mounting part on which an electronic component can be mounted; and
 a component non-mounting part on which an electronic component cannot be mounted,
 wherein a portion located in the component non-mounting part of one wiring layer of the plurality of the wiring layers includes a plurality of first through-holes having an elongated shape as seen from above and aligned with predetermined intervals with longitudinal directions of the first through-holes being faced toward a direction perpendicular to a longitudinal direction of the wiring substrate.

According to the disclosed technology, it is possible to provide the wiring substrate having improved bendability.

BRIEF DESCRIPTION OF DRAWINGS

Exemplary embodiment(s) of the present invention will be described in detail based on the following figures, wherein.

DESCRIPTION OF EMBODIMENTS

Figure 1A:
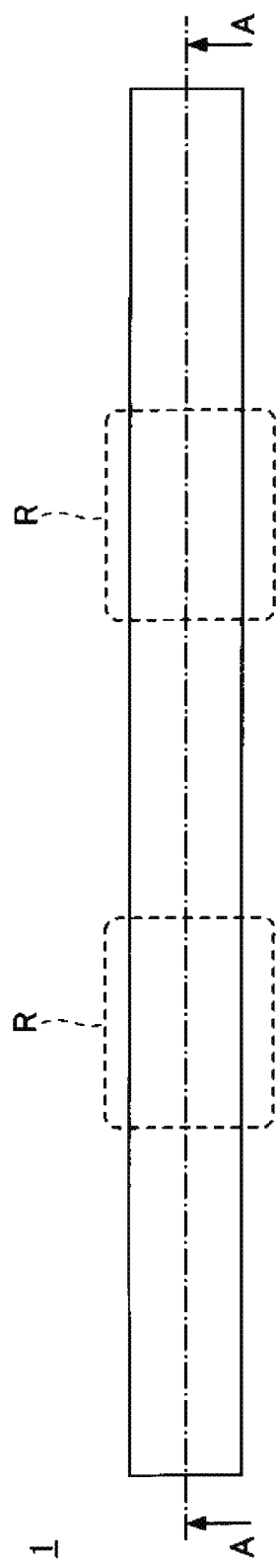
FIG. 1A is a plan view illustrating a wiring substrate according to an exemplary embodiment.

Hereinafter, exemplary embodiments of the present invention will be described with reference to the drawings. Meanwhile, in the respective drawings, the same constitutional parts are denoted with the same reference numerals, and the overlapping descriptions thereof may be omitted.

EXEMPLARY EMBODIMENT

[Structure of Wiring Substrate of Exemplary Embodiment]

Figure 1B:
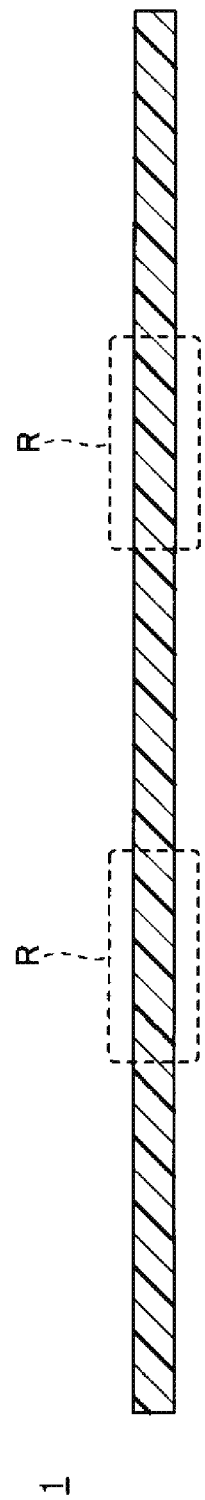
FIG. 1B is a sectional view taken along a line A-A of FIG. 1A.
Figure 2A:
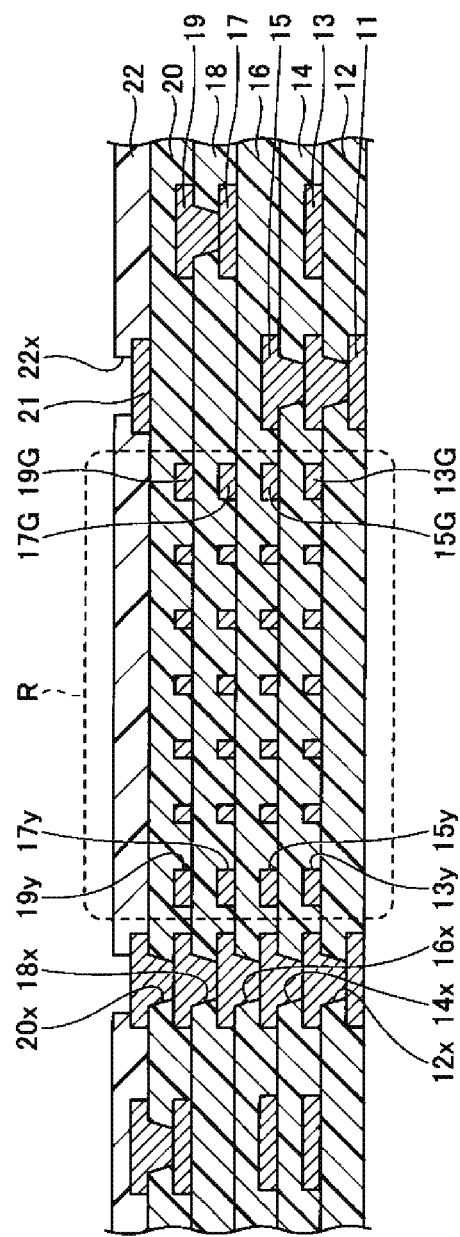
FIG. 2A is a partially enlarged sectional view illustrating a vicinity of a component non-mounting part of the wiring substrate according to the exemplary embodiment.
Figure 2B:
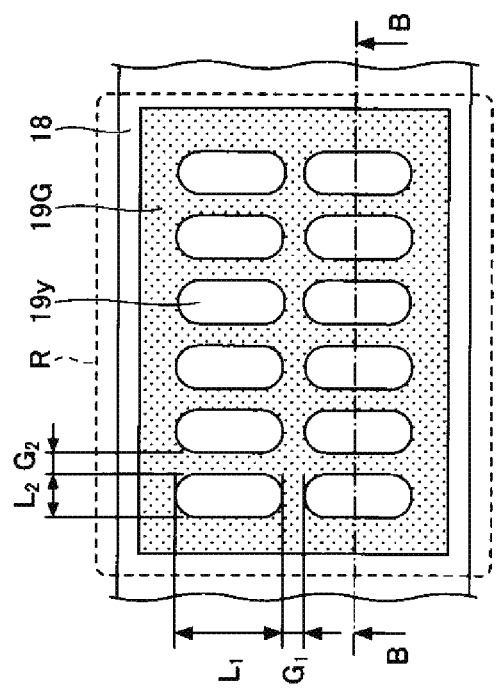
FIG. 2B is a partially enlarged plan view illustrating the vicinity of the component non-mounting part of the wiring substrate according to the exemplary embodiment.

First, a structure of a wiring substrate according to an exemplary embodiment is described. FIG. 1A is a plan view illustrating the wiring substrate according to the exemplary embodiment. FIG. 1B is a sectional view taken along a line A-A of FIG. 1A. FIG. 2A is a partially enlarged sectional view illustrating a vicinity of an R part of the wiring substrate according to the exemplary embodiment. FIG. 2B is a partially enlarged plan view illustrating the vicinity of the R part of the wiring substrate according to the exemplary embodiment. In the meantime, FIG. 2A shows a section taken along a line B-B of FIG. 2B. Also, FIG. 2B depicts only an insulation layer 18 and a wiring layer 19 of the R part of FIG. 2A.

Referring to FIGS. 1A to 2B, a wiring substrate 1 is a coreless wiring substrate in which a plurality of wiring layers and a plurality of insulation layers are stacked. The wiring substrate 1 has flexibility. Here, the flexibility indicates a property allowing bending and flexing.

As shown in FIG. 2A, the wiring substrate 1 has the plurality of wiring layer (for example, six layers), and each wiring layer is stacked via the insulation layer.

More specifically, the wiring substrate 1 has a structure where a wiring layer 11, an insulation layer 12, a wiring layer 13, an insulation layer 14, a wiring layer 15, an insulation layer 16, a wiring layer 17, an insulation layer 18, a wiring layer 19, an insulation layer 20, a wiring layer 21, and a solder resist layer 22 are sequentially stacked. In the meantime, the numbers of the wiring layers and the insulation layers may be determined as appropriate, as required.

Meanwhile, in the exemplary embodiment, for convenience sake, the solder resist layer 22-side of the wiring substrate 1 is referred to as 'upper side' or 'one side', and the wiring layer 11-side is referred to as 'lower side' or 'the other side'. Also, a surface of each part facing toward the solder resist layer 22 is referred to as 'one surface' or 'upper surface', and a surface facing toward the wiring layer 11 is referred to as 'the other surface' or 'lower surface'. However, the wiring substrate 1 can be used upside down or can be arranged at any angle. Also, the description 'as seen from above' indicates that a target is seen from a normal direction of one surface of the wiring substrate 1 (the upper surface of the solder resist layer 22), and the planar shape indicates a shape of the target, as seen from the normal direction of one surface of the wiring substrate 1 (the upper surface of the solder resist layer 22).

Also, in the exemplary embodiment, the description 'parallel and vertical' includes not only strictly parallel and vertical states but also substantially parallel and vertical states within a range in which the operational effects of the exemplary embodiment are exhibited.

The wiring layer 11 is formed at the lowest layer of the wiring substrate 1. The wiring layer 11 may have a structure where a gold (Au) film, a palladium (Pd) film, a nickel (Ni) film, and a copper (Cu) film are stacked in corresponding order so that the gold (Au) film is located at the lower side. In the meantime, in the wiring layer 11, the palladium (Pd) film and the nickel (Ni) film may not be formed.

The lower surface of the wiring layer 11 (in the above case, the lower surface of the gold (Au) film) is exposed from the lower surface of the insulation layer 12, and the upper surface (except a connection part with the wiring layer 13) and side surfaces are covered with the insulation layer 12. The lower surface of the wiring layer 11 may be formed to be flush with the lower surface of the insulation layer 12, for example. A thickness of the wiring layer 11 (a total thickness of the respective films configuring the wiring layer 11) may be set to about 10 to 20 μm, for example. The wiring layer 11 may be used as pads that are to be connected to terminals of an electronic component, for example.

The insulation layer 12 is formed to cover the wiring layer 11. As a material of the insulation layer 12, for example, a flexible insulating resin (for example, a thermosetting resin) having a low Young's modulus may be used. As the flexible insulating resin having a low Young's modulus, for example, an insulating resin of which a main component is a polyimide-based resin, an epoxy-based resin or the like may be exemplified. A thickness of the insulation layer 12 may be set to about 20 to 45 μm, for example. The insulation layer 12 may contain filler such as silica ($SiO_2$).

The wiring layer 13 is formed on one side of the insulation layer 12 and is electrically connected to the wiring layer 11. Via holes $12x$ penetrate the insulation layer 12 and are formed to expose one surface of the wiring layer 11. The wiring layer 13 includes via wirings filled in the via holes $12x$, and a wiring pattern formed on one surface of the insulation layer 12. The via hole $12x$ is formed as a concave portion having an inverted conical shape where a diameter of an opening opened toward the insulation layer 14 is larger than a diameter of a bottom surface of an opening formed by the upper surface of the wiring layer 11. The diameter of the opening of the via hole $12x$ may be set to about 60 to 70 μm, for example.

As a material of the wiring layer 13, copper (Cu) and the like may be used, for example. A thickness of the wiring pattern configuring the wiring layer 13 may be set to about 10 to 20 μm, for example. The wiring layer 13 may be formed as a fine wiring of which line and space (hereinafter, referred to as 'line/space') are about 10 m/10 μm to 20 μm/20 μm. In the meantime, the line of the line/space indicates a wiring width, and the space indicates an interval between the adjacent wirings (wiring interval). For example, the line/space of 10 μm/10 μm indicates that the wiring width is 10 μm and the interval between the adjacent wirings is 10 μm.

The insulation layer 14 is formed on one surface of the insulation layer 12 so as to cover the wiring layer 13. A material and a thickness of insulation layer 14 may be the same as the insulation layer 12, for example. The insulation layer 14 may contain filler such as silica ($SiO_2$).

The wiring layer 15 is formed on one side of the insulation layer 14, and is electrically connected to the wiring layer 13. Via holes $14x$ penetrate the insulation layer 14 and are formed to expose one surface of the wiring layer 13. The wiring layer 15 includes via wirings filled in the via holes $14x$, and a wiring pattern formed on one surface of the insulation layer 14. The via hole $14x$ is formed as a concave portion having an inverted conical shape where a diameter of an opening opened toward the insulation layer 16 is larger than a diameter of a bottom surface of an opening formed by the upper surface of the wiring layer 13. The diameter of the opening of the via hole $14x$ may be set to about 60 to 70 μm, for example. A material of the wiring layer 15, and a thickness and a line/space of the wiring pattern configuring the wiring layer 15 may be the same as the wiring layer 13, for example.

The insulation layer 16 is formed on one surface of the insulation layer 14 so as to cover the wiring layer 15. A material and a thickness of insulation layer 16 may be the same as the insulation layer 12, for example. The insulation layer 16 may contain filler such as silica ($SiO_2$).

The wiring layer 17 is formed on one side of the insulation layer 16, and is electrically connected to the wiring layer 15. Via holes $16x$ penetrate the insulation layer 16 and are formed to expose one surface of the wiring layer 15. The wiring layer 17 includes via wirings filled in the via holes $16x$, and a wiring pattern formed on one surface of the insulation layer 16. The via hole $16x$ is formed as a concave portion having an inverted conical shape where a diameter of an opening opened toward the insulation layer 18 is larger than a diameter of a bottom surface of an opening formed by the upper surface of the wiring layer 15. The diameter of the opening of the via hole $16x$ may be set to about 60 to 70 μm, for example. A material of the wiring layer 17, and a thickness and a line/space of the wiring pattern configuring the wiring layer 17 may be the same as the wiring layer 13, for example.

The insulation layer 18 is formed on one surface of the insulation layer 16 so as to cover the wiring layer 17. A material and a thickness of insulation layer 18 may be the same as the insulation layer 12, for example. The insulation layer 18 may contain filler such as silica ($SiO_2$).

The wiring layer 19 is formed on one side of the insulation layer 18, and is electrically connected to the wiring layer 17. Via holes 18x penetrate the insulation layer 18 and are formed to expose one surface of the wiring layer 17. The wiring layer 19 includes via wirings filled in the via holes 18x, and a wiring pattern formed on one surface of the insulation layer 18. The via hole 18x is formed as a concave portion having an inverted conical shape where a diameter of an opening opened toward the insulation layer 20 is larger than a diameter of a bottom surface of an opening formed by the upper surface of the wiring layer 17. The diameter of the opening of the via hole 18x may be set to about 60 to 70 µm, for example. A material of the wiring layer 19, and a thickness and a line/space of the wiring pattern configuring the wiring layer 19 may be the same as the wiring layer 13, for example.

The insulation layer 20 is formed on one surface of the insulation layer 18 so as to cover the wiring layer 19. A material and a thickness of insulation layer 20 may be the same as the insulation layer 12, for example. The insulation layer 20 may contain filler such as silica ($SiO_2$).

The wiring layer 21 is formed on one side of the insulation layer 20, and is electrically connected to the wiring layer 19. Via holes 20x penetrate the insulation layer 20 and formed to expose one surface of the wiring layer 19. The wiring layer 21 includes via wirings filled in the via holes 20x, and a wiring pattern formed on one surface of the insulation layer 20. The via hole 20x is formed as a concave portion having an inverted conical shape where a diameter of an opening opened toward solder resist layer 22 is larger than a diameter of a bottom surface of an opening formed by the upper surface of the wiring layer 19. The diameter of the opening of the via hole 20x may be set to about 60 to 70 µm, for example. A material of the wiring layer 21, and a thickness and a line/space of the wiring pattern configuring the wiring layer 21 may be the same as the wiring layer 13, for example.

The solder resist layer 22 is formed on one surface of the insulation layer 20 so as to cover the wiring layer 21. The solder resist layer 22 may be formed of a photosensitive resin such as an epoxy-based resin, an acryl-based resin and the like, for example. A thickness of the solder resist layer 22 may be set to about 15 to 35 µm, for example.

The solder resist layer 22 has openings 22x, and portions of the upper surface of the wiring layer 21 are exposed in the openings 22x. A planar shape of the opening 22x may be circular, for example. If necessary, the upper surface of the wiring layer 21 exposed in the openings 22x may be formed with a metal layer or may be subjected to antioxidant processing such as OSP (Organic Solderability Preservative) processing. As the metal layer, an Au layer, a Ni/Au layer (a metal layer having a Ni layer and an Au layer stacked in corresponding order), a Ni/Pd/Au layer (a metal layer having a Ni layer, a Pd layer and an Au layer stacked in corresponding order), and the like may be exemplified.

Portions exposed in the openings 22x of wiring layer 21 may be used as pads that are to be connected to terminals of an electronic component.

In the wiring substrate 1, the upper surface of each wiring layer arranged on each via wiring is planar and is not formed with a concave portion. Therefore, as shown in FIG. 2A, it is possible to implement a stack via structure where the via wirings are vertically stacked. Thereby, it is possible to improve a density of the wiring layers of the wiring substrate 1, and to improve reliability of the electrical connection between the respective wiring layers through the via wirings. In the meantime, a form where the stack via structure is not provided is also possible.

The wiring substrate 1 has component mounting parts on which an electronic component can be mounted, and component non-mounting parts R on which an electronic component cannot be mounted. A region of the wiring substrate 1 except the component non-mounting parts R shown with the broken line is the component mounting part, and an electronic component can be mounted at a proper position of the component mounting part.

The component non-mounting part R of the wiring substrate 1 is a bendable part designed on the assumption that it will be bent. Meanwhile, in FIG. 1A, the wiring substrate 1 is provided at two places with the component non-mounting parts R but the component non-mounting part R may be provided at one place or at three or more places. Like this, when the component non-mounting part R is provided at one or more places, it is possible to easily bend the wiring substrate 1 in the longitudinal direction (a direction of a line A-A of FIG. 1A or a line B-B of FIG. 2B). That is, the longitudinal direction of the wiring substrate 1 is a bending direction.

The wiring pattern configuring each wiring layer may be arranged in any of the component mounting part and the component non-mounting part R. However, the via wiring is arranged only in the component mounting part. The via wiring is arranged only in the component mounting part, which is regarded as not being bent, without being arranged in the component non-mounting part R, so that it is possible to prevent the via wiring from being cracked when bending the component non-mounting part R.

A portion located in the component non-mounting part R of the wiring layer 19 is formed with a pattern 19G to be connected to a GND. The pattern 19G is formed with a plurality of elongated through-holes 19y. A planar shape of the through-hole 19y is not particularly limited inasmuch as it has an elongated shape having a longitudinal direction (long-side direction) and a width direction (short-side direction). For example, an elliptical shape, a rectangular shape, a round cornered rectangular shape of which at least one corner is rounded (including a shape where a short side of the rectangular shape has a circular arc shape), and the like may be exemplified.

The respective through-holes 19y are aligned with predetermined intervals in a state where longitudinal directions thereof are faced toward a direction perpendicular to the bending direction of the wiring substrate 1. In FIG. 2B, the through-holes 19y are aligned in two lines in parallel with the bending direction (longitudinal direction) of the wiring substrate 1 but may be aligned in one line or in three or more lines.

A length $L_1$ in the longitudinal direction of the through-hole 19y may be set to about 400 to 700 µm, for example. A length $L_2$ in the width direction of the through-hole 19y may be set to about 100 to 400 µm, for example. An interval $G_1$ between the through-holes 19y adjacent to each other in the direction perpendicular to the bending direction of the wiring substrate 1 may be set to about 20 to 100 µm, for example. An interval $G_2$ between the through-holes 19y adjacent to each other in the bending direction of the wiring substrate 1 may be set to about 20 to 100 µm, for example.

From a standpoint of securing the favorable bendability by reducing a wiring pattern formation density in the component non-mounting part R, the through-holes 19y are preferably aligned so that the interval $G_2$ between the through-holes 19y adjacent to each other in the bending direction of the wiring substrate 1 is smaller than the length $L_2$ in the width direction of the through-hole 19y. This applies to through-holes 13y, 15y, 17y, too, which will be described later.

Portions located in the component non-mounting part R of the wiring layers 13, 15, 17 are formed with patterns 13G, 15G, 17G to be connected to the GND, like the pattern 19G. The patterns 13G, 15G, 17G are formed with through-holes 13y, 15y, 17y, each of which has the same dimension as the through-hole 19y, at positions overlapping the through-holes 19y, as seen from above.

Portions located in the component non-mounting part R of the wiring layers 11, 21 may also be formed with patterns as appropriate, and may be formed with through-holes, each of which has the same dimension as the through-hole 19y, at positions overlapping the through-holes 19y, as seen from above. In the meantime, from the standpoint of securing the favorable bendability by reducing the wiring pattern formation density in the component non-mounting part R, the number of the wiring layers in the component non-mounting part R is preferably smaller than the number of the wiring layers in the component mounting part (six layers in the wiring substrate 1). In the wiring substrate 1, the number of the wiring layers in the component non-mounting part R is four but may be five or three or smaller.

Meanwhile, the portion in located in the component non-mounting part R of each wiring layer, the pattern to be connected to the GND functions as a shield pattern for shielding noises. However, the portion located in the component non-mounting part R in each wiring layer may be formed with a wiring pattern except the pattern to be connected to the GND, too.

For example, in the portion located in the component non-mounting part R of any wiring layer, both sides of a signal pattern may be shielded with a GND pattern. In this case, the through-holes may be arranged with avoiding the signal pattern, and when the signal pattern is not shorted, the signal pattern may be formed with the through-holes. Also, for example, the wiring layers 13, 19 located at an outer side in the thickness direction may be formed with only a GND pattern, and the wiring layers 15, 17 located at an inner side in the thickness direction may be formed with only the signal pattern.

[Manufacturing Method of Wiring Substrate of Exemplary Embodiment]

Subsequently, a manufacturing method of the wiring substrate of the exemplary embodiment is described. FIGS. 3A to 3D and 4A to 4C are views illustrating manufacturing processes of the wiring substrate according to the exemplary embodiment. In the exemplary embodiment, an example of processes of manufacturing one wiring substrate on a support member and removing the support member is described. However, processes of manufacturing parts becoming a plurality of wiring substrates on the support member, and segmenting the parts into the respective wiring substrates after removing the support member are also possible.

Figure 3A:
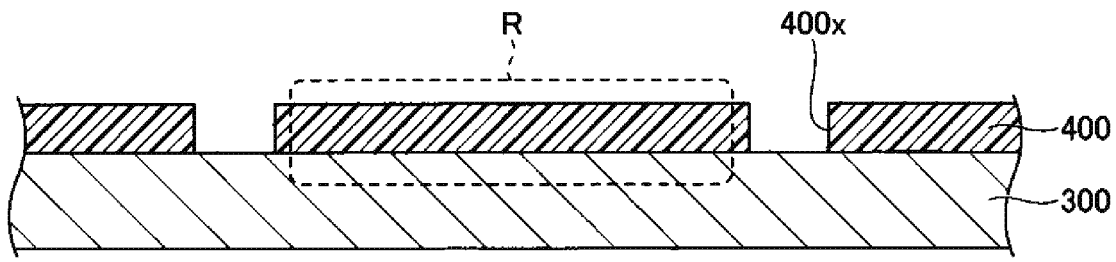
FIGS. 3A to 3D are views illustrating manufacturing processes of the wiring substrate according to the exemplary embodiment (1 thereof).

First, in a process of FIG. 3A, a support member 300 of which an upper surface is a flat surface is prepared, and an upper surface of the support member 300 is formed with a resist layer 400 (for example, a dry film resist or the like) having openings 400x at portions in which a wiring layer 11 is to be formed. As the support member 300, a metal plate, a metal foil or the like may be used. However, in the exemplary embodiment, an example where a copper foil is used as the support member 300 is described. A thickness of the support member 300 may be set to about 18 to 100 μm, for example.

Figure 3B:
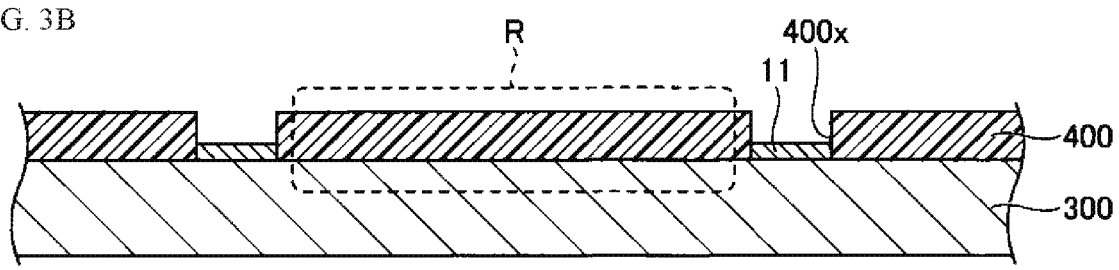

Then, in a process of FIG. 3B, a wiring layer 11 is formed on the upper surface of the support member 300 exposed in the openings 400x of the resist layer 400 by an electrolytic plating method in which the support member 300 is used as a plating power feeding layer, for example. Thereafter, the resist layer is removed. A material and a thickness of the wiring layer 11 are as described above.

Figure 3C:
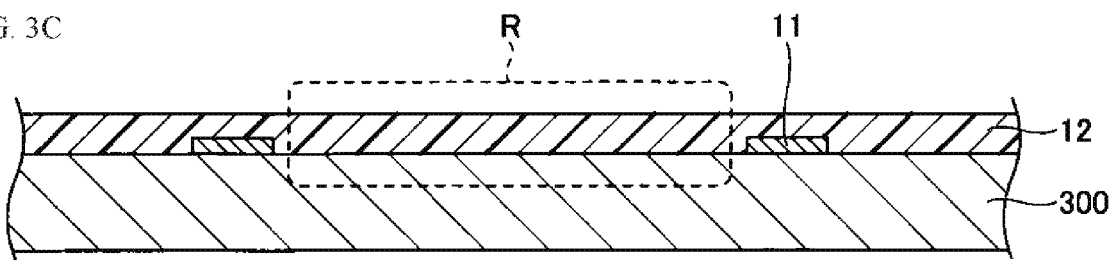

Then, in a process of FIG. 3C, a semi-cured film-shaped resin is laminated on the upper surface of the support member 300 so as to cover a upper surface and side surfaces of the wiring layer 11 and is then cured to form an insulation layer 12, for example. Alternatively, instead of laminating the film-shaped resin, a liquid or paste resin may be applied and cured to form the insulation layer 12. A material and a thickness of the insulation layer 12 are as described above.

Figure 3D:
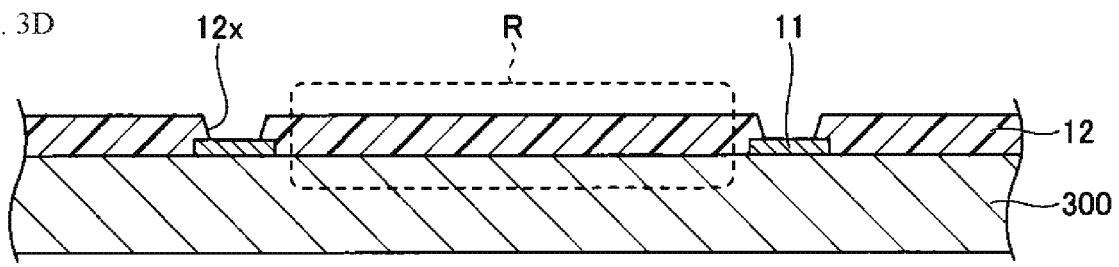

Then, in a process of FIG. 3D, the insulation layer 12 is formed with via holes 12x penetrating the insulation layer 12 and exposing an upper surface of the wiring layer 11. The via hole 12x may be formed by a laser processing method of using $CO_2$ laser or the like, for example. After forming the via holes 12x, desmear processing is preferably performed to remove resin remnants attached on a surface of the wiring layer 11 exposed to bottom portions of the via holes 12x.

Figure 4A:
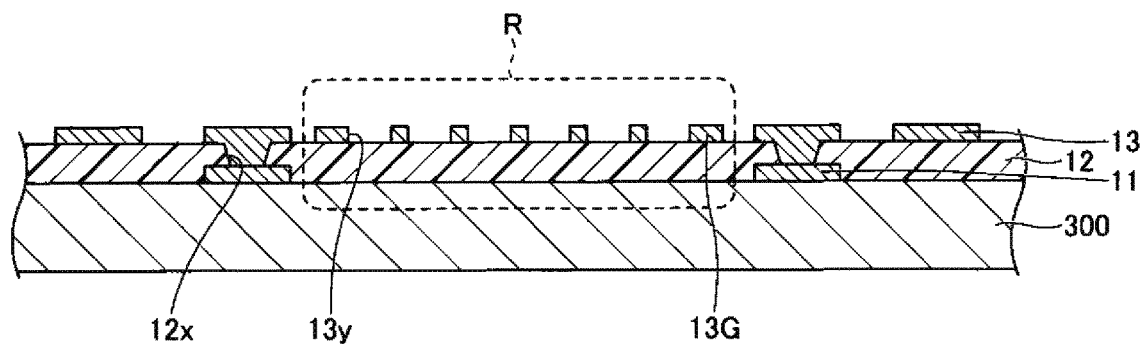
FIG. 4A to 4C are views illustrating manufacturing processes of the wiring substrate according to the exemplary embodiment (2 thereof).

Then, in a process of FIG. 4A, a wiring layer 13 is formed on one side of the insulation layer 12. The wiring layer 13 includes via wirings filled in the via holes 12x and a wiring pattern formed on an upper surface of the insulation layer 12. Also, in the component non-mounting part R, a pattern 13G to be connected to the GND is formed and the pattern 13G is formed with through-holes 13y. The via wiring, the wiring pattern, and the pattern 13G having the through-holes 13y, which configure the wiring layer 13, may be formed at the same time by using a semi-additive method or a subtractive method, for example. A material of the wiring layer 13, and a thickness and a line/space of the wiring pattern configuring the wiring layer 13 are as described above. The wiring layer 13 is electrically connected to the wiring layer 11 exposed to the bottom portions of the via holes 12x.

Figure 4B:
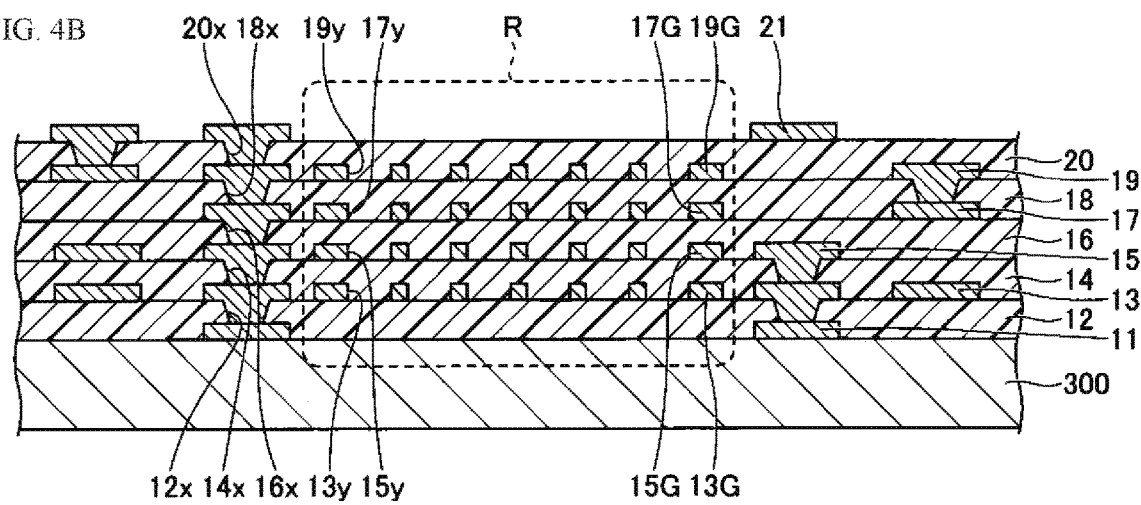

Then, in a process of FIG. 4B, the processes of FIGS. 3C to 4A are repeatedly performed to sequentially form an insulation layer 14, a wiring layer 15, an insulation layer 16, a wiring layer 17, an insulation layer 18, a wiring layer 19, an insulation layer 20, and a wiring layer 21.

Figure 4C:
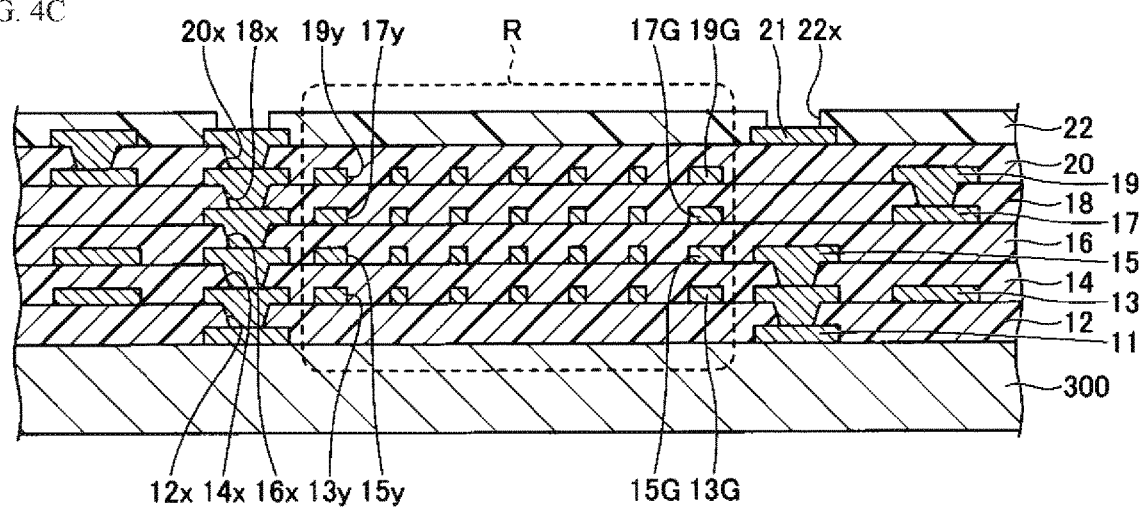

Then, in a process of FIG. 4C, a solder resist layer 22 is formed on an upper surface of the insulation layer 20 so as to cover the wiring layer 21. The solder resist layer 22 may be formed by applying a liquid or paste photosensitive epoxy-based resin or acryl-based resin on the upper surface of the insulation layer 20 so as to cover the wiring layer 21 by a screen printing method, a roll coat method, a spin coat method or the like, for example. Alternatively, for example, the solder resist layer 22 may be formed by laminating a film-shaped photosensitive epoxy-based resin or acryl-based rein on the upper surface of the insulation layer 20 so as to cover the wiring layer 21.

Then, the solder resist layer 22 is exposed and developed to form the solder resist layer 22 with openings 22x for exposing portions of the upper surface of the wiring layer 21 (photolithography method). In the meantime, the openings 22x may be formed by a laser processing method or blast processing. In this case, for the solder resist layer 22, the photosensitive material may not be used. A planar shape of the opening 22x may be circular, for example. A diameter of the opening 22x may be arbitrarily designed in conformity to a connection target (a semiconductor chip or the like).

In the meantime, the upper surface of the wiring layer 21 exposed to bottom portions of the openings 22x may be formed thereon with the above-described metal layer by an electroless plating method or the like, for example. Also, instead of forming the metal layer, the antioxidant processing such as OSP processing may be performed. Also, the upper surface of the wiring layer 21 exposed to the bottom portions of the openings 22x may be formed thereon with external connection terminals such as solder bumps.

After the process of FIG. 4C, the support member 300 shown in FIG. 4C is removed, so that the wiring substrate 1 (refer to FIGS. 1A to 2B) is completed.

The support member 300 that is a copper foil may be removed by a wet etching using an aqueous ferric chloride solution, an aqueous copper chloride solution, an aqueous ammonium persulfate solution or the like. In the meantime, the process of forming the solder resist layer 22 shown in FIG. 4C may be performed after removing the support member 300.

Like this, the component non-mounting parts R are demarcated for the wiring substrate 1, and the portions located in the component non-mounting part R of the wiring layers are formed with the plurality of elongated through-holes aligned with the predetermined intervals in the state where the longitudinal directions thereof are faced toward the direction perpendicular to the bending direction of the wiring substrate 1. Thereby, it is possible to reduce a bending elastic modulus of the component non-mounting part R, thereby improving the bendability of the component non-mounting part R.

Also, the respective through-holes formed in the component non-mounting part R can function as degassing holes. The respective through-holes function as degassing holes, so that it is possible to reduce a risk that voids will be generated in the wiring substrate 1. Here, the degassing hole is a hole for gas removal for escaping a gas, which is to be generated in the wiring substrate upon heating, to an outside in the manufacturing process of the wiring substrate Meanwhile, the component non-mounting part R of the wiring substrate 1 may be configured only by an insulation layer having flexibility, without the solder resist layer. Also, the component non-mounting part R of the wiring substrate 1 may be formed so that the wiring and the pad are not to be exposed from the outermost layer.

Modified Example of Exemplary Embodiment

In a modified example of the exemplary embodiment, an example where arrangements of the through-holes formed in the wiring layers adjacent to each other in the thickness direction in the component non-mounting part R are different is described. Meanwhile, in the modified example of the exemplary embodiment, the descriptions of the same constitutional components as the exemplary embodiment may be omitted.

Figure 5A:
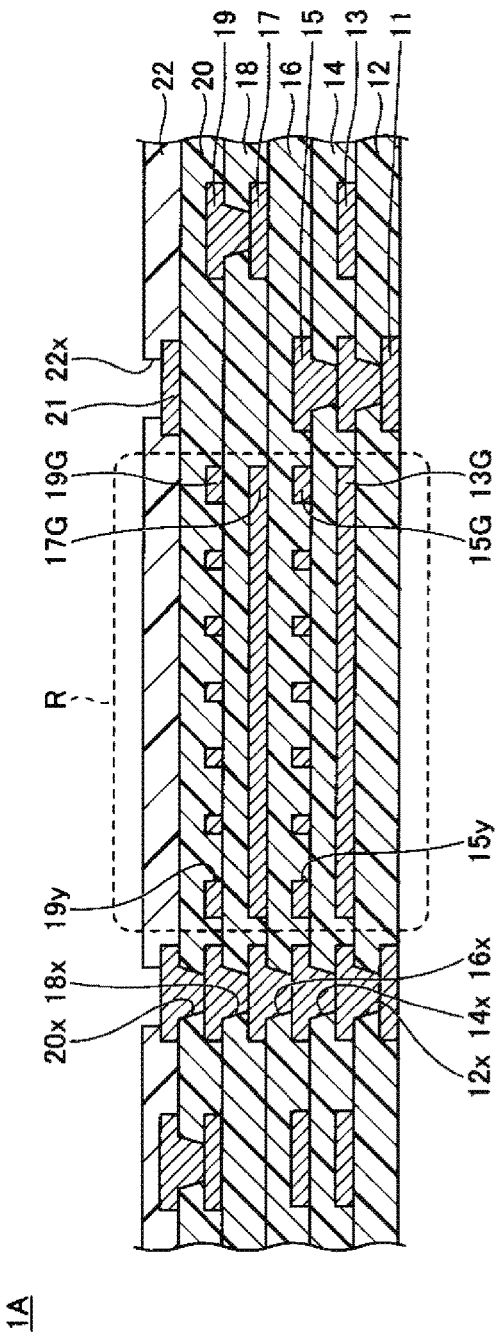
FIG. 5A is a partially enlarged sectional view illustrating a vicinity of a component non-mounting part of a wiring substrate according to a modified example of the exemplary embodiment.
Figure 5B:
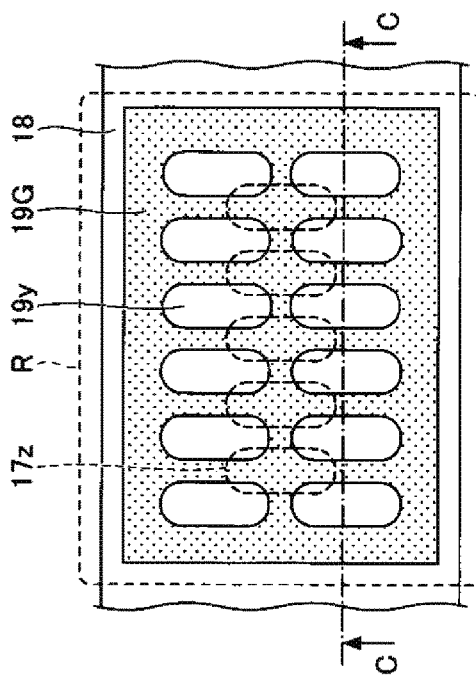
FIG. 5B is a partially enlarged plan view illustrating the vicinity of the component non-mounting part of the wiring substrate according to the modified example of the exemplary embodiment.

FIG. 5A is a partially enlarged sectional view corresponding to FIG. 2A illustrating a vicinity of the R part of a wiring substrate according to the modified example of the exemplary embodiment. FIG. 5B is a partially enlarged plan view corresponding to FIG. 2B illustrating a vicinity of the R part of a wiring substrate according to the modified example of the exemplary embodiment. In the meantime, FIG. 5A is a section taken along a line C-C of FIG. 5B. Also, in FIG. 5B, only the wiring layer 17, the insulation layer 18, and the wiring layer 19 in the R part of FIG. 5A are shown.

Referring to FIGS. 5A and 5B, in the component non-mounting part R of a wiring substrate 1A, the through-holes formed in the wiring layers adjacent to each other in the thickness direction are arranged in a zigzag shape, as seen from above.

That is, the portion located in the component non-mounting part R of the wiring layer 19 is formed with a pattern 19G to be connected to a GND. The pattern 19G is formed with a plurality of elongated through-holes 19y aligned with predetermined intervals in a state where the longitudinal directions thereof are faced toward the direction perpendicular to a bending direction of the wiring substrate 1A (a direction of a line C-C of FIG. 5B), like the wiring substrate 1.

The portion located in the component non-mounting part R of the wiring layer 17 is formed with a pattern 17G to be connected to the GND, like the pattern 19G. The pattern 17G is formed with through-holes 17z having the same dimensions as the through-hole 19y, arranged in a zigzag shape with respect to the respective through-holes 19y, as seen from above, and partially overlapping the respective through-holes 19y.

The portion located in the component non-mounting part R of the wiring layer 15 is formed with a pattern 15G to be connected to the GND, like the pattern 19G. The pattern 15G is formed with through-holes 15y having the same dimensions as the through-holes 19y at positions overlapping the through-holes 19y, as seen from above.

The portion located in the component non-mounting part R of the wiring layer 13 is formed with a pattern 13G to be connected to the GND, like the pattern 19G. The pattern 13G is formed with through-holes 13z (not shown in FIGS. 5A and 5B) having the same dimensions as the through-holes 17z at positions overlapping the through-holes 17z, as seen from above.

Like this, the component non-mounting parts R are demarcated for the wiring substrate 1A, and the portions located in the component non-mounting part R of the wiring layers are formed with the plurality of elongated through-holes aligned with the predetermined intervals in the state where the longitudinal directions thereof are faced toward the direction perpendicular to the bending direction of the wiring substrate 1A. In the component non-mounting part R of the wiring substrate 1A, the through-holes formed in the wiring layers adjacent to each other in the thickness direction are arranged in the zigzag shape, as seen from above, and the through-holes formed in the wiring layers adjacent to each other in the thickness direction partially overlap each other.

Thereby, it is possible to secure the same favorable bendability as the wiring substrate 1, in the component non-mounting part R, and to improve the degassing hole function of the respective through-holes (since the through-holes formed in the wiring layers adjacent to each other partially overlap each other, the gas is likely to be escaped). The degassing hole function of the respective through-holes is improved, so that it is possible to further reduce a risk that voids will be generated in the wiring substrate 1A, as compared to the wiring substrate 1.

<Simulation>

A simulation of the bending elastic modulus was performed for each case of FIGS. 6A to 6E of a wiring substrate having the same layer structure as the wiring substrate 1 (the total number of the wiring layers is six layers, and the number of the wiring layers in the component non-mounting part R is four layers). In the simulation, one-second symmetrical model was performed using Ansys Workbench v18.

Figure 6A:
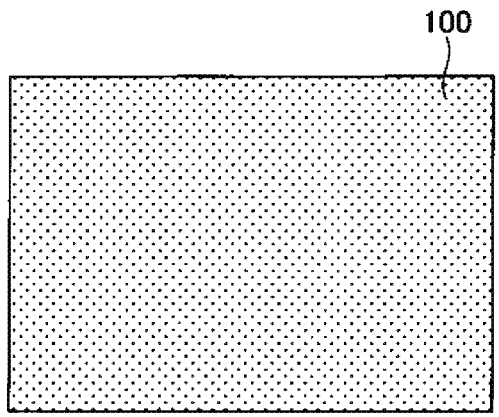
FIGS. 6A to 6E are view illustrating simulation conditions.

FIG. 6A depicts a case where a portion located in the component non-mounting part R of each wiring layer 100 of the wiring substrate is not formed with the through-holes (a case where only the pattern with no through-hole is formed). The respective wiring layers 100 described here indicate the four inner wiring layers corresponding to the wiring layers 13, 15, 17, 19 of the wiring substrate 1 (cases of FIGS. 6B to 6E are also the same). Also, the arrow indicates the bending direction of the wiring substrate (the longitudinal direction of the wiring substrate) (the cases of FIGS. 6B to 6E are also the same).

Figure 6B:
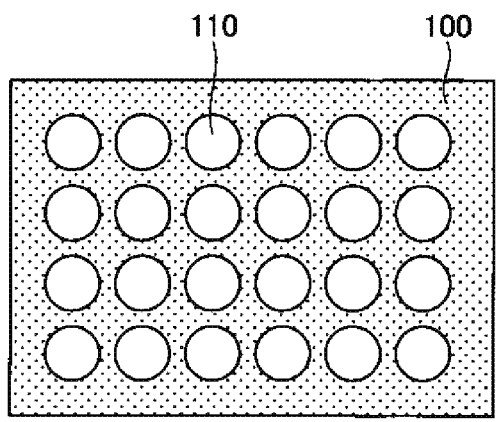

FIG. 6B depicts a case where a portion located in the component non-mounting part R of each wiring layer 100 of the wiring substrate is formed with through-holes 110, of which a planar shape is circular, in a matrix shape. The portion located in the component non-mounting part R of each wiring layer 100 is formed with through-holes having the same dimensions as the through-holes 110 at positions overlapping the through-holes 110, as seen from above. A diameter of the through-hole 110 is ϕ250 μm, and pitches of the through-holes 110 in row and column directions are 300 μm.

Figure 6C:
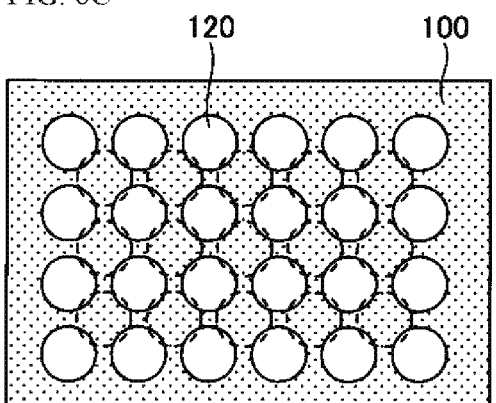

FIG. 6C depicts a case where a portion located in the component non-mounting part R of each wiring layer 100 of the wiring substrate is formed with through-holes 120, of which a planar shape is circular, in a matrix shape. The portion located in the component non-mounting part R of each wiring layer 100 is formed with through-holes having the same dimensions as the through-holes 120. The through-holes formed in the wiring layers adjacent to each other in the thickness direction in the component non-mounting part R are aligned in a zigzag shape, as seen from above. A diameter of the through-hole 120 is ϕ250 μm, and pitches of the through-holes 120 in row and column directions are 300 μm.

Figure 6D:
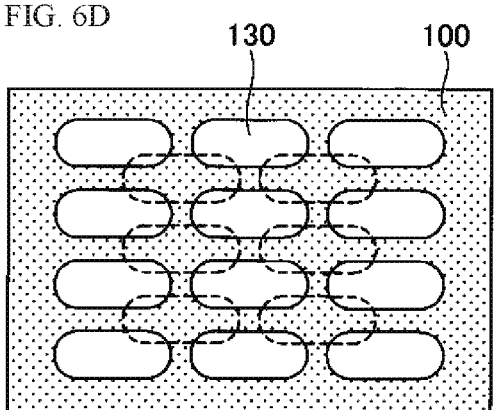

FIG. 6D depicts a case where a portion located in the component non-mounting part R of each wiring layer 100 of the wiring substrate is formed with through-holes 130, of which a planar shape is an elongated shape (a shape where a short side of the rectangular shape is formed in a circular arc shape), in a matrix shape. That is, the through-holes 130 of which a planar shape is an elongated shape are aligned with predetermined intervals in a state where the longitudinal directions thereof are faced toward a direction parallel with the bending direction of the wiring substrate.

The portion located in the component non-mounting part R of each wiring layer 100 is formed with through-holes having the same dimensions as the through-holes 130. The through-holes formed in the wiring layers adjacent to each other in the thickness direction in the component non-mounting part R are aligned in a zigzag shape, as seen from above. A width of a rectangular part (a part except both ends having a circular arc shape) of the through-hole 130 is 250 μm, and a length is 300 μm. Also, the circular arc parts of both ends of the through-hole 130 are respectively a half of a circle having a diameter of ϕ250 μm (a half circle). Also, a pitch of the through-holes 130 in the row direction is 600 μm, and a pitch in the column direction is 300 μm.

Figure 6E:
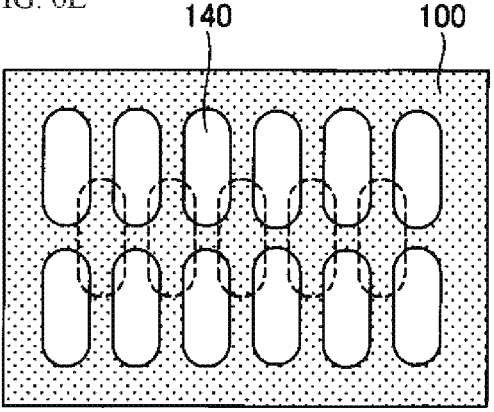

FIG. 6E depicts a case where a portion located in the component non-mounting part R of each wiring layer 100 of the wiring substrate is formed with through-holes 140, of which a planar shape is an elongated shape (a shape where a short side of the rectangular shape is formed in a circular arc shape), in a matrix shape. That is, the through-holes 140 of which a planar shape is an elongated shape are aligned with predetermined intervals in a state where the longitudinal directions thereof are faced toward a direction perpendicular to the bending direction of the wiring substrate.

The portion located in the component non-mounting part R of each wiring layer 100 is formed with through-holes having the same dimensions as the through-holes 140. The through-holes formed in the wiring layers adjacent to each other in the thickness direction in the component non-mounting part R are aligned in a zigzag shape, as seen from above. A width of a rectangular part (a part except both ends having a circular arc shape) of the through-hole 140 is 250 μm, and a length is 300 μm. Also, the circular arc parts of both ends of the through-hole 130 are respectively a half of a circle having a diameter of ϕ250 μm (a half circle). Also, a pitch of the through-holes 140 in the row direction is 300 μm, and a pitch in the column direction is 600 μm.

Figure 7:
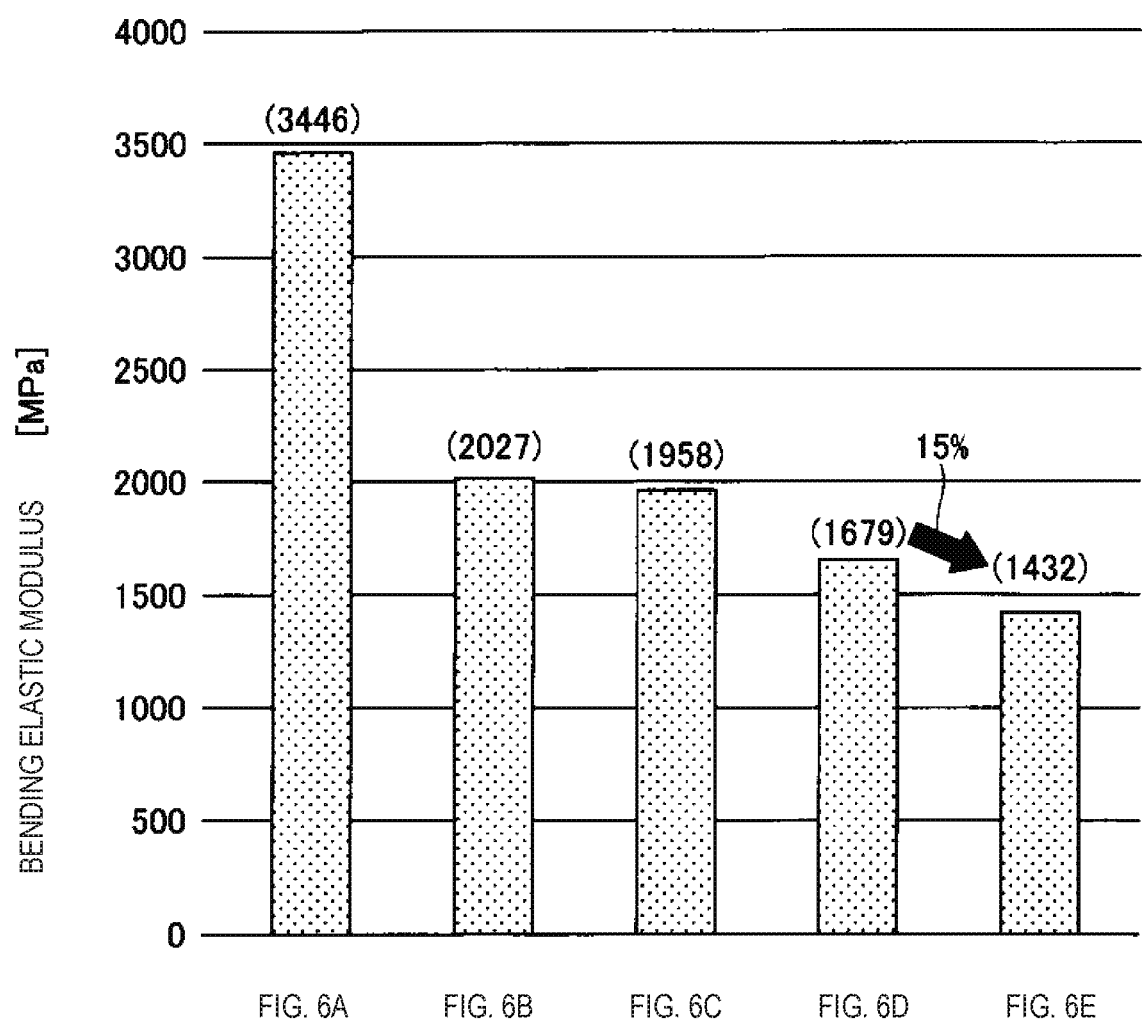
FIG. 7 is a view illustrating a simulation result.

In each case of FIGS. 6A to 6E, a simulation of the bending elastic modulus was performed, so that a result shown in FIG. 7 was obtained.

From FIG. 7, it can be seen that the bending elastic modulus of the component non-mounting part R was reduced in the cases of FIGS. 6B and 6C where the circular through-holes are formed and in the cases of FIGS. 6D and 6E where the elongated through-holes are formed, as compared to the case of FIG. 6A where the through-hole is not formed.

Also, it can be seen that the bending elastic modulus of the component non-mounting part R was more reduced in the cases of FIGS. 6D and 6E where the elongated through-holes are formed, as compared to the cases of FIGS. 6B and 6C where the circular through-holes are formed. Particularly, the bending elastic modulus of the component non-mounting part R was more reduced by about 15% in the case of FIG. 6E where the elongated through-holes are aligned with the longitudinal directions thereof being faced toward the direction perpendicular to the bending direction of the wiring substrate, as compared to the case of FIG. 6D where the elongated through-holes are aligned with the longitudinal directions thereof being faced toward the direction parallel with the bending direction of the wiring substrate.

In this way, the portion located in the component non-mounting part R of each wiring layer is formed with the through-holes, so that it is possible to reduce the bending elastic modulus of the component non-mounting part R. In particular, it was confirmed that when the elongated through-holes are aligned with the longitudinal directions thereof being faced toward the direction perpendicular to the bending direction of the wiring substrate, it is possible to most reduce the bending elastic modulus of the component non-mounting part R. That is, from the standpoint of securing the favorable bendability in the component non-mounting part R, it can be said that the shape of FIG. 6E is most preferable.

In the meantime, according to the simulation results of FIGS. 6B and 6C, the bending elastic modulus of the component non-mounting part R is little influenced, depending on whether the through-holes are aligned in the zigzag shape, as seen from above. Therefore, even when the through-holes 140 of FIG. 6E are not aligned in the zigzag shape, as seen from above, it is thought that it is possible to sufficiently reduce the bending elastic modulus of the component non-mounting part R.

Although the preferred exemplary embodiments have been described in detail, the present invention is not limited to the exemplary embodiments, and the exemplary embodiments can be diversely modified and replaced without departing from the scope of the claims.

Figure 8A:
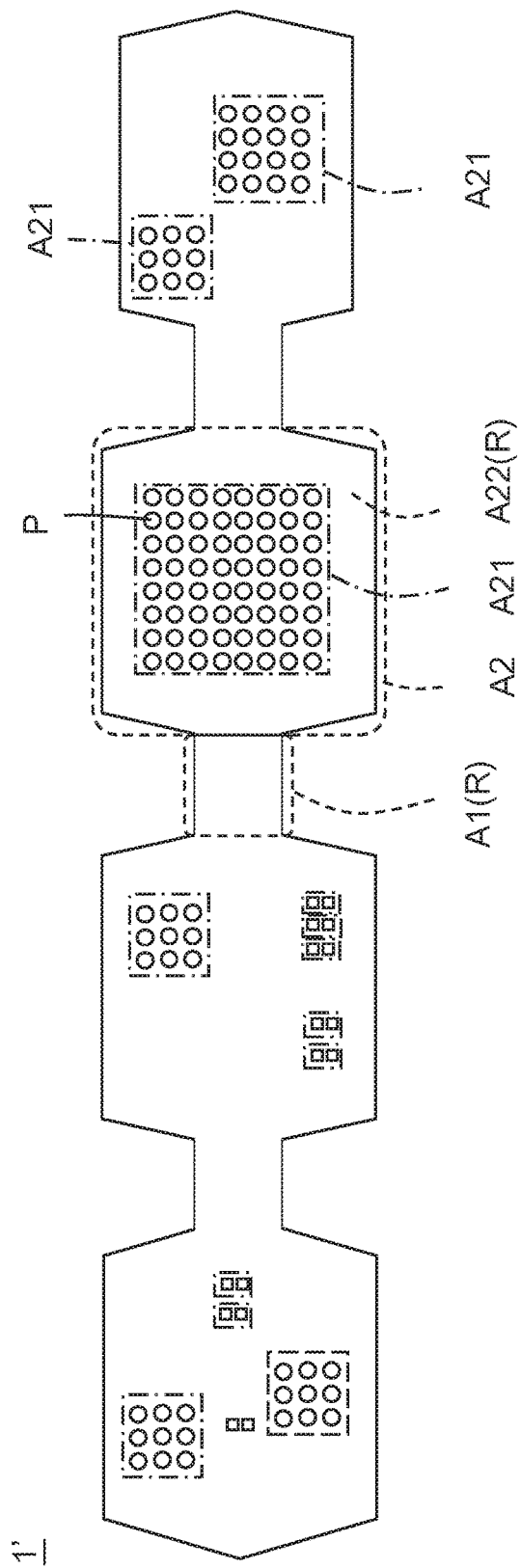
FIG. 8A is a plan view illustrating another wiring substrate according to the exemplary embodiment.
Figure 8B:
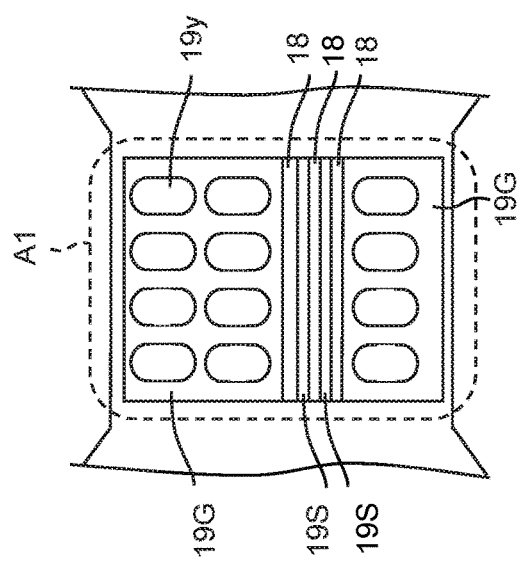
FIG. 8B is a partially enlarged plan view illustrating a vicinity of a bendable area of the wiring substrate of FIG. 8A.

FIG. 8A is a plan view illustrating another wiring substrate 1' according to the exemplary embodiment. FIG. 8B is a partially enlarged plan view illustrating a vicinity of an A1 part of the wiring substrate 1' of FIG. 8A. FIG. 8B depicts only an insulation layer 18 and a wiring layer 19 of the A1 part. The wiring substrate 1' is a coreless wiring substrate in which a plurality of wiring layers and a plurality of insulation layers are stacked. The stacked structure of the wiring substrate 1' is the same as that of the wiring substrate 1 and thus, its detailed explanation will be omitted.

The wiring substrate 1' has a plurality of bendable areas A1 (for example, three areas) and a plurality of mounting areas A2 (for example, four areas). The adjacent plurality of mounting areas A2 are connected to each other via the bendable area A1. In FIG. 8A, A1 and A2 are indicated only for each one area in view of the simplified illustration. As shown in FIG. 8B, a portion located in the bendable area A1 of the wiring layer 19 is formed with patterns 19G to be connected to a GND and signal patterns 19S. Both sides of the signal patterns 19S are shielded with the GND patterns 19G. Each pattern 19G is formed with a plurality of elongated through-holes 19y. The respective through-holes 19y are aligned with predetermined intervals in a state where longitudinal directions thereof are faced toward a direction perpendicular to the bending direction of the wiring substrate 1.

The mounting area A2 has a component arrangement region A21 and a component non-arrangement region A22. The mounting area A2 may have a plurality of component arrangement regions A21. Each component arrangement region A21 is a component mounting part on which an electronic component can be mounted. Each component arrangement region A21 corresponds to an outer shape of the electronic component to be arranged shown with the dash-dot line. Pads P that are to be connected to the terminals of the electronic component are arranged in the component arrangement region A21. For example, portions exposed in an openings 22x of wiring layer 21 (See FIG. 2A) are used as the pads P. The component non-arrangement region A22 is a region except for the component arrangement region A21 in the mounting area A2. The component non-arrangement regions A22 and the bendable areas A1 are component non-mounting parts R on which electronic components cannot be mounted.

As mentioned above, the component non-mounting parts R(A1, A22) are demarcated for the wiring substrate 1', and the portion located in the component non-mounting part R of the wiring layer is formed with the plurality of elongated through-holes aligned with the predetermined intervals in the state where the longitudinal directions thereof are faced toward the direction perpendicular to the bending direction (longitudinal direction) of the wiring substrate 1'. Thereby, it is possible to secure the same favorable bendability as the wiring substrate 1, in the component non-mounting part R.

What is claimed is:

1. A wiring substrate comprising:
a plurality of wiring layers, the plurality of wiring layers being stacked in a height direction of the wiring substrate;
a component mounting part on which an electronic component can be mounted; and
a component non-mounting part on which an electronic component cannot be mounted,
wherein
the component mounting part and the component non-mounting part are arranged next to each other in a longitudinal direction of the wiring substrate,
a portion located in the component non-mounting part of one wiring layer of the plurality of the wiring layers includes a plurality of first through-holes each having an elongated shape as seen from above, the elongated shape having a dimension in a width direction of the wiring substrate greater than a dimension in the longitudinal direction of the wiring substrate, and the plurality of first through-holes are aligned with predetermined intervals, the width direction of the wiring substrate, the longitudinal direction of the wiring substrate, and the height direction of the wiring substrate being perpendicular to each other,
a portion located in the component non-mounting part of another wiring layer of the plurality of the wiring layers includes a plurality of second through-holes each having an elongated shape as seen from above, the elongated shape of each of the plurality of second through-holes having a dimension in the width direction of the wiring substrate greater than a dimension in the longitudinal direction of the wiring substrate, and the plurality of second through-holes are aligned with predetermined intervals, and
the first through-holes and the second through-holes are aligned in a zigzag shape, as seen from above, and are partially overlapped, as seen from above.

2. The wiring substrate according to claim 1,
wherein the plurality of second through-holes is aligned so that an interval between the second through-holes adjacent to each other in the longitudinal direction of the wiring substrate is smaller than the dimension of each of the second through-holes in the longitudinal direction of the wiring substrate.

3. The wiring substrate according to claim 1,
wherein the plurality of first through-holes is aligned so that an interval between the first through-holes adjacent to each other in the longitudinal direction of the wiring substrate is smaller than the dimension of each of the first through-holes in the longitudinal direction of the wiring substrate.

4. The wiring substrate according to claim 1,
wherein each of the wiring layers has a via wiring configured to electrically connect the wiring layers vertically adjacent to each other via an insulation layer, wherein the via wiring is arranged only in the component mounting part.

5. The wiring substrate according to claim 1,
wherein a number of wiring layers stacked in the height direction of the wiring substrate in the component non-mounting part is smaller than the number of wiring layers stacked in the height direction of the wiring substrate in the component mounting part.

6. The wiring substrate according to claim 1,
wherein at least one wiring layer of the plurality of the wiring layers has a pattern that is to be connected to a GND, and the pattern is located in the component non-mounting part.

7. The wiring substrate according to claim 1,
wherein the wiring substrate has an elongated shape with a dimension in the longitudinal direction of the wiring substrate being greater than a dimension in the width direction of the wiring substrate.

8. The wiring substrate according to claim 7,
wherein the component mounting part comprises a first component mounting part and a second component mounting part, the first component mounting part and the second component mounting part being entirely separated from each other with the component non-mounting part disposed therebetween.

9. The wiring substrate according to claim 8,
wherein each of the first component mounting part, the second component mounting part, and the component non-mounting part extend to widthwise ends of the wiring substrate.

10. The wiring substrate according to claim 7,
wherein each of the component mounting part and the component non-mounting part extend to widthwise ends of the wiring substrate.

11. The wiring substrate according to claim 1,
wherein the component mounting part comprises a first component mounting part and a second component mounting part, the first component mounting part and the second component mounting part being entirely separated from each other with the component non-mounting part disposed therebetween.

12. The wiring substrate according to claim 11,
wherein each of the first component mounting part, the second component mounting part, and the component non-mounting part extend to widthwise ends of the wiring substrate.

13. The wiring substrate according to claim 1,
wherein each of the component mounting part and the component non-mounting part extend to widthwise ends of the wiring substrate.

\* \* \* \* \*